(12) United States Patent
Hwang et al.

(10) Patent No.: US 9,966,974 B2
(45) Date of Patent: May 8, 2018

(54) APPARATUS AND METHOD FOR PROVIDING COMPATIBILITY OF TRANSMISSION SIGNAL IN COMMUNICATION SYSTEM

(75) Inventors: Sung-Hee Hwang, Gyeonggi-do (KR); Hak-Ju Lee, Incheon (KR); Se-Ho Myung, Gyeonggi-do (KR); Jin-Hee Jeong, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 885 days.

(21) Appl. No.: 13/349,106

(22) Filed: Jan. 12, 2012

(65) Prior Publication Data

US 2012/0183003 A1 Jul. 19, 2012

(30) Foreign Application Priority Data

Jan. 14, 2011 (KR) .................. 10-2011-0003854

(51) Int. Cl.
*H04L 29/02* (2006.01)
*H03M 13/05* (2006.01)
(Continued)

(52) U.S. Cl.
CPC ........ *H03M 13/2732* (2013.01); *H04H 20/42* (2013.01); *H04H 60/23* (2013.01); *H04L 1/0041* (2013.01); *H04L 1/0072* (2013.01); *H04L 65/4076* (2013.01); *H04L 65/607* (2013.01); *H04N 21/2383* (2013.01); *H04N 21/23895* (2013.01); *H04N 21/4382* (2013.01); *H04N 21/43853* (2013.01); *H04N 21/6332* (2013.01); *H03M 13/09* (2013.01); *H03M 13/1102* (2013.01); *H03M 13/152* (2013.01);
(Continued)

(58) Field of Classification Search
CPC ................ H04L 1/0072; H04L 1/0041; H04L 25/03866; H04L 1/0071; H04L 1/004; H04L 1/0083; H03M 13/63; H03M 13/27
See application file for complete search history.

(56) References Cited

U.S. PATENT DOCUMENTS 5,600,721 A * 2/1997 Kitazato .............. H04N 7/1675
348/420.1
6,021,391 A * 2/2000 Shyu ........................ H04L 9/12
380/279
(Continued)

FOREIGN PATENT DOCUMENTS

KR 1020090004665 1/2009
KR 1020100114441 10/2010
(Continued)

OTHER PUBLICATIONS

Mexican Office Action dated May 15, 2015 issued in counterpart application No. MX/a/2015/001852.
(Continued)

*Primary Examiner* — Hoang-Chuong Q Vu
(74) *Attorney, Agent, or Firm* — The Farrell Law Firm, P.C.

(57) ABSTRACT

Method and apparatus for transmitting and receiving a signal in a broadcasting communication system are provided. Data of an input stream is divided for transmission through a frame. A header that includes information about the input stream is constructed. The frame is constructed using the header and the divided data.

16 Claims, 11 Drawing Sheets

(51) Int. Cl.
*H03M 13/27* (2006.01)
*H04L 1/00* (2006.01)
*H04N 21/2383* (2011.01)
*H04N 21/2389* (2011.01)
*H04N 21/438* (2011.01)
*H04N 21/4385* (2011.01)
*H04N 21/6332* (2011.01)
*H04H 20/42* (2008.01)
*H04H 60/23* (2008.01)
*H04L 29/06* (2006.01)
*H03M 13/09* (2006.01)
*H03M 13/11* (2006.01)
*H03M 13/15* (2006.01)
*H03M 13/29* (2006.01)

(52) U.S. Cl.
CPC ......... *H03M 13/2906* (2013.01); *H04L 69/22* (2013.01)

(56) References Cited

U.S. PATENT DOCUMENTS

| | | | |
|---|---|---|---|
| 6,075,789 A | 6/2000 | Kasslin et al. | |
| 6,201,798 B1* | 3/2001 | Campanella et al. | 370/326 |
| 6,349,138 B1* | 2/2002 | Doshi | H04L 1/0057 348/E7.069 |
| 6,490,243 B1* | 12/2002 | Tanaka | H03M 13/00 370/216 |
| 7,054,376 B1* | 5/2006 | Rubinstain et al. | 375/261 |
| 7,627,806 B1* | 12/2009 | Vijayaraghavan | H03M 13/09 714/807 |
| 2003/0009663 A1* | 1/2003 | Pelletier | H04L 69/04 713/160 |
| 2004/0057499 A1* | 3/2004 | Haartsen | H04L 25/03866 375/136 |
| 2005/0047433 A1* | 3/2005 | Rizer et al. | 370/464 |
| 2005/0047497 A1* | 3/2005 | Rubinstain et al. | 375/222 |
| 2005/0226414 A1 | 10/2005 | Lee et al. | |
| 2007/0081563 A1* | 4/2007 | Seo | H04J 3/0632 370/542 |
| 2007/0277077 A1* | 11/2007 | Vesma | H03M 13/1515 714/755 |
| 2008/0002567 A1* | 1/2008 | Bourlas | H04L 1/0046 370/208 |
| 2008/0037540 A1* | 2/2008 | Ngo | H04L 1/0041 370/392 |
| 2009/0013369 A1* | 1/2009 | Seo | H04N 21/434 725/131 |
| 2009/0063936 A1* | 3/2009 | Kanda | H03M 13/11 714/776 |
| 2009/0232124 A1* | 9/2009 | Cordeiro | H01Q 3/26 370/349 |
| 2010/0031124 A1* | 2/2010 | Shinagawa | H03M 13/036 714/777 |
| 2010/0070822 A1* | 3/2010 | Leung | H04L 1/0072 714/752 |
| 2010/0080266 A1* | 4/2010 | Zhang | H04J 13/102 375/140 |
| 2010/0329247 A1* | 12/2010 | Kennedy et al. | 370/389 |
| 2011/0134905 A1* | 6/2011 | Wang et al. | 370/345 |
| 2011/0202270 A1* | 8/2011 | Sharma | G06Q 30/02 701/533 |
| 2012/0117442 A1* | 5/2012 | Lee | H04L 1/008 714/755 |
| 2014/0161209 A1* | 6/2014 | Limberg | H04L 5/0016 375/299 |
| 2015/0078477 A1* | 3/2015 | Hong | H04L 27/2627 375/295 |
| 2016/0020869 A1 | 1/2016 | Oh et al. | |
| 2017/0195160 A1* | 7/2017 | Ko | H04L 27/34 |

FOREIGN PATENT DOCUMENTS

| | | |
|---|---|---|
| WO | WO 2010/053984 | 5/2010 |
| WO | WO 2010/079873 | 7/2010 |
| WO | WO 2010/085025 | 7/2010 |
| WO | WO 2010/101328 | 9/2010 |

OTHER PUBLICATIONS

International Standard, Information Technology—Generic Coding of Moving Pictures and Associated Audio Information: Systems, ISO/IEC 13818-1, Second Edition, Dec. 1, 2000.
Digital Video Broadcasting (DVB); Frame Structure Channel Coding and Modulation for a Second Generation Digital Terrestrial Television Broadcasting System (DVB-T2), Final Draft ETSI EN 302 755 V1.2.1, Oct. 2010.
Digital Video Broadcasting (DVB); Frame Structure Channel Coding and Modulation for a Second Generation Digital Transmission System for Cable Systems (DVB-C2) ETSI EN 302 769 V1.1.1, Apr. 2010.
Digital Video Broadcasting (DVB); Second Generation Framing Structure, Channel Coding and Modulation Systems for Broadcasting, Interactive Services, News Gathering and other Broadband Satellite Applications (DVB-S2), ETSI EN 302 307 V1.2.1, Aug. 2009.
Digital Video Broadcasting (DVB); Frame Structure Channel Coding and Modulation for a Second Generation Digital Transmission System for Cable Systems (DVB-C2) ETSI EN 302 769 V1.2.1, Dec. 2010, 111 pages.
Korean Office Action dated May 30, 2016 issued in counterpart application No. 10-2011-0003854, 12 pages.
European Search Report dated Aug. 11, 2016 issued in counterpart application No. 12734232.7-1906, 12 pages.
Canadian Office Action dated Jan. 24, 2017 issued in counterpart application No. 2,824,283, 5 pages.
Korean Office Action dated May 11, 2017 issued in counterpart application No. 10-2011-0003854, 5 pages.
Canadian Office Action dated Oct. 17, 2017 issued in counterpart application No. 2,824,283, 7 pages.

* cited by examiner

APPARATUS AND METHOD FOR PROVIDING COMPATIBILITY OF TRANSMISSION SIGNAL IN COMMUNICATION SYSTEM

PRIORITY

This application claims priority under 35 U.S.C. § 119(a) to a Korean Patent Application filed in the Korean Intellectual Property Office on Jan. 14, 2011 and assigned Serial No. 10-2011-0003854, the contents of which are incorporated herein by reference.

BACKGROUND OF THE INVENTION

1. Field of the Invention

The present invention relates generally to transmission signals in a communication system, and more particularly, to an apparatus and method for providing compatibility for a newly defined input stream in a communication system.

2. Description of the Related Art

A Moving Picture Experts Group 2-Transport Stream (MPEG2-TS) packet is defined for audio and video broadcasting data transmission. The MPEG2-TS is constructed to have a fixed length of 188 bytes, which includes a header of 4 bytes and an adaptation field/payload of 184 bytes.

For audio and video broadcasting data transmission, a transmit end transmits a frame constructed from input of an input stream of the MPEG2-TS packets, to a receive end. A header of the frame represents the type of input stream included in a data field. The type of the input stream includes, for example, a Generic Fixed Packetized Stream (GFPS), a Transport Stream (TS) (i.e., an MPEG2-TS), a Generic Continuous Stream (GCS), Generic Stream Encapsulation (GSE) and the like.

High-density content, such as 3-Dimensional (3D) or Ultra-Definition (UD) contents, has attracted greater attention, and audio and video broadcasting communication now requires high-speed data transmission.

However, the MPEG2-TS packet is inefficient for high-speed data transmission because the MPEG2-TS packet requires the header of 4 bytes for every payload data of 184 bytes.

SUMMARY OF THE INVENTION

The present invention has been made to address at least the above problems and/or disadvantages and to provide at least the advantages described below.

Accordingly, one aspect of the present invention is to provide an apparatus and method for expressing the type of a newly defined input stream in a communication system.

Another aspect of the present invention is to provide an apparatus and method for expressing the type of a newly defined input stream in a communication system that uses both a previously defined input stream and the newly defined input stream.

A further aspect of the present invention is to provide an apparatus and method for expressing the type of a newly defined input stream without changing a previously defined header form in a communication system that uses both a previously defined input stream and the newly defined input stream.

Yet another aspect of the present invention is to provide an apparatus and method for providing compatibility for a newly defined input stream in a communication system that uses both a previously defined input stream and the newly defined input stream.

Still another aspect of the present invention is to provide an apparatus and method for providing compatibility for a newly defined input stream using a Cyclic Redundancy Check (CRC) error in a communication system.

Another aspect of the present invention is to provide an apparatus and method for providing compatibility for a newly defined input stream using a Forward Error Correction (FEC) error in a communication system.

Still another additional aspect of the present invention is to provide an apparatus and method for scrambling a header and providing compatibility for a newly defined input stream in a transmit end of a communication system.

Another aspect of the present invention is to provide an apparatus and method for scrambling a FEC frame and providing compatibility for an input stream in a transmit end of a communication system.

According to one aspect of the present invention, a method is provided for transmitting a signal in a broadcasting communication system. Data of an input stream is determined for transmission through a frame. A header that includes information about an input stream is constructed. The frame is constructed using the header and the determined data of the input stream. The information about the input stream is represented in the header using at least one of a MODE field of a CRC—8 MODE field, an EXT field of a MATYPE field, and the MATYPE field.

According to another aspect of the present invention, a method is provided for transmitting a signal in a broadcasting communication system. Data of an input stream is determined for transmission through a frame. A header that includes information about the input stream is constructed. The header is scrambled. The frame is constructed using the scrambled header and the determined data of the input stream.

According to a further aspect of the present invention, a method is provided for transmitting a signal in a broadcasting communication system. Data of an input stream is determined for transmission through a frame. A header that includes information about the input stream is constructed. The header is added to the determined data. The header is scrambled. The determined data, which includes the scrambled header, is padded to increase a length of the frame, and the frame is constructed.

According to yet another aspect of the present invention, a method is provided for transmitting a signal in a broadcasting communication system. Data of an input stream is determined for transmission through a frame. A header that includes information about the input stream is constructed. A frame is constructed using the header and the determined data of the input stream. The frame is scrambled. An FEC frame is constructed using the scrambled frame. The FEC frame is scrambled.

According to still another aspect of the present invention, an apparatus is provided for transmitting a signal in a broadcasting communication system. The apparatus includes a data generator, a control signal generator, and a frame constructor. The data generator determines data of an input stream for transmission through a frame. The control signal generator constructs a header that includes information about the input stream. The frame constructor constructs the frame using the header and the determined data of the input stream. The information about the input stream is represented in the header using at least one of a MODE field of a Cyclic Redundancy Check (CRC)—8 MODE field, an EXT field of a MATYPE field, and the MATYPE field.

According to still another aspect of the present invention, an apparatus is provided for transmitting a signal in a broadcasting communication system. The apparatus includes a data generator, a control signal generator, a scrambler, and a frame constructor. The data generator determines data of an input stream for transmission through a frame. The control signal generator constructs a header that includes information about the input stream. The scrambler scrambles the header. The frame constructor constructs the frame using the scrambled header and the determined data of the input stream.

According to still another aspect of the present invention, an apparatus is provided for transmitting a signal in a broadcasting communication system. The apparatus includes a data generator, a control signal generator, and a frame constructor. The data generator determines data of an input stream for transmission through a frame. The control signal generator constructs a header that includes information about the input stream. The frame constructor adds the header to the determined data, scrambles the header, pads the determined data, which includes the scrambled header, to increase a length of the frame, and constructs the frame.

According to still another aspect of the present invention, an apparatus is provided for transmitting a signal in a broadcasting communication system. The apparatus includes a data generator, a control signal generator, a 1st frame constructor, a 1st scrambler, a 2nd frame constructor, and a 2nd scrambler. The data generator determines data of an input stream for transmission through a frame. The control signal generator constructs a header that includes information about the input stream. The 1st frame constructor constructs the frame using the header and the determined data of the input stream. The 1st scrambler scrambles the frame. The 2nd frame constructor constructs a FEC frame using the frame scrambled in the 1st scrambler. The 2nd scrambler scrambles the FEC frame.

According to another aspect of the present invention, a method is provided for receiving a signal in a broadcasting communication system. When a signal is received, it is determined whether a Cyclic Redundancy Check (CRC) error occurs in the signal. When the CRC error occurs in the signal, a frame header of the signal is descrambled. Data of the signal is restored using the descrambled frame header.

According to a further aspect of the present invention, a method is provided for receiving a signal in a broadcasting communication system. When a signal is received, it is determined whether an FEC error occurs in the signal. When the FEC error occurs in the signal, an FEC frame in which the FEC error occurs is descrambled. The descrambled FEC frame is decoded and data of the descrambled FEC frame is restored.

According to an additional aspect of the present invention, an apparatus is provided for receiving a signal in a broadcasting communication system. The apparatus includes a receiver for receiving a signal. The apparatus also includes a frame processor for, when a Cyclic Redundancy Check (CRC) error occurs in the signal, descrambling a frame header in the signal, and restoring data of the signal using the descrambled frame header.

According to yet another aspect of the present invention, an apparatus is provided for receiving a signal in a broadcasting communication system. The apparatus includes a receiver for receiving a signal. The apparatus also includes a frame processor for, when a Forward Error Correction (FEC) error occurs in the signal, descrambling an FEC frame in which the FEC error occurs, and decoding the descrambled FEC frame and restoring data of the descrambled FEC frame.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF EMBODIMENTS OF THE PRESENT INVENTION

Figure 1:
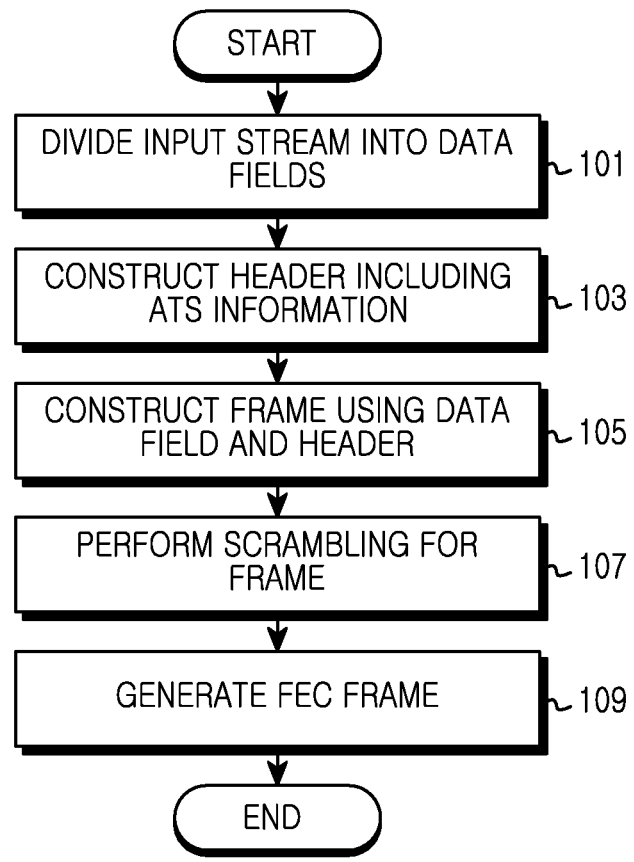
FIG. 1 is a flowchart illustrating a procedure for transmitting an Advanced Transport Stream (ATS) in a transmit end, according to an embodiment of the present invention.

Embodiments of the present invention are described in detail with reference to the accompanying drawings. The same or similar components may be designated by the same or similar reference numerals. Detailed descriptions of constructions or processes known in the art may be omitted to avoid obscuring the subject matter of the present invention. Terms described below, which are defined considering functions in the present invention, can be different depending on user and operator's intention or practice. Therefore, the terms should be defined on the basis of the disclosure.

A technology for providing compatibility for a newly defined input stream (i.e., ATS) in a communication system is described below, according to an embodiment of the present invention.

The following description is made assuming that a communication system provides compatibility between an MPEG2-TS and a newly defined input stream. Specifically, a technology for transmitting information of a newly defined input stream is described herein, which does not deform a header construction of a frame including an MPEG2-TS. However, embodiments of the present invention are also applicable to a case where a communication system provides compatibility between other constructed input streams and a newly defined input stream. The newly defined input stream includes an input stream composed of transmission packets having a variable length. The transmission packets are variable in length according to a transmission environment.

Figure 2:
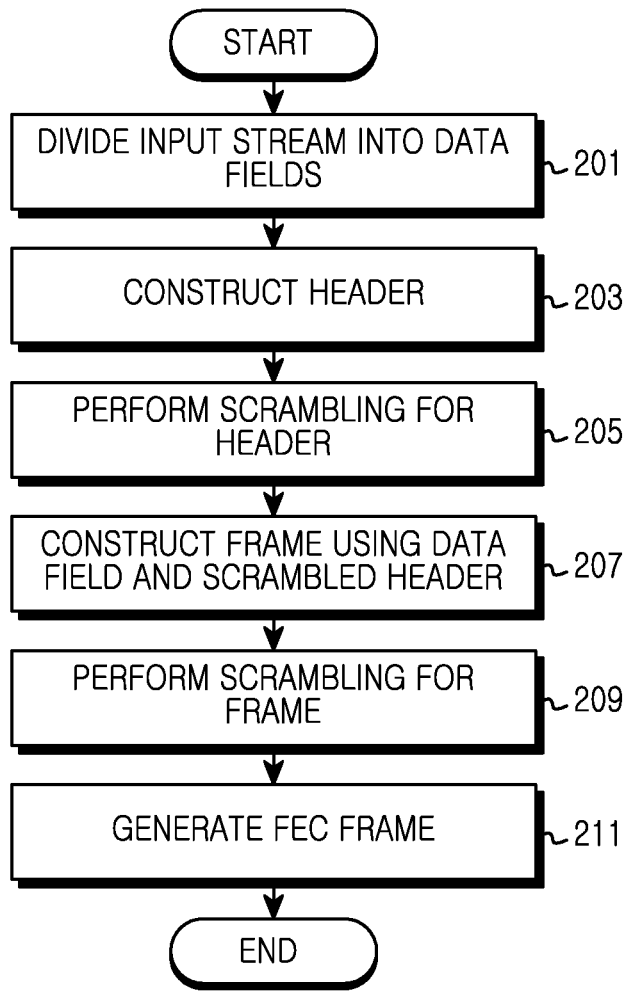
FIG. 2 is a flowchart illustrating a procedure for transmitting an ATS using a Cyclic Redundancy Check (CRC) error in a transmit end, according to an embodiment of the present invention.
Figure 3:
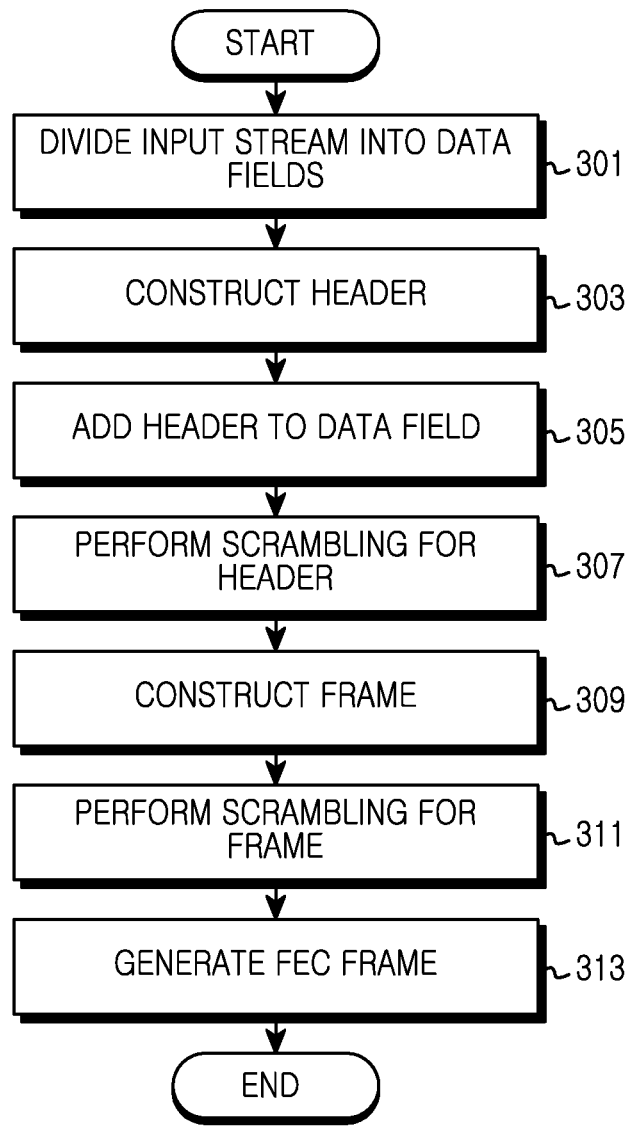
FIG. 3 is a flowchart illustrating a procedure for transmitting an ATS using a CRC error in a transmit end, according to another embodiment of the present invention.
Figure 4:
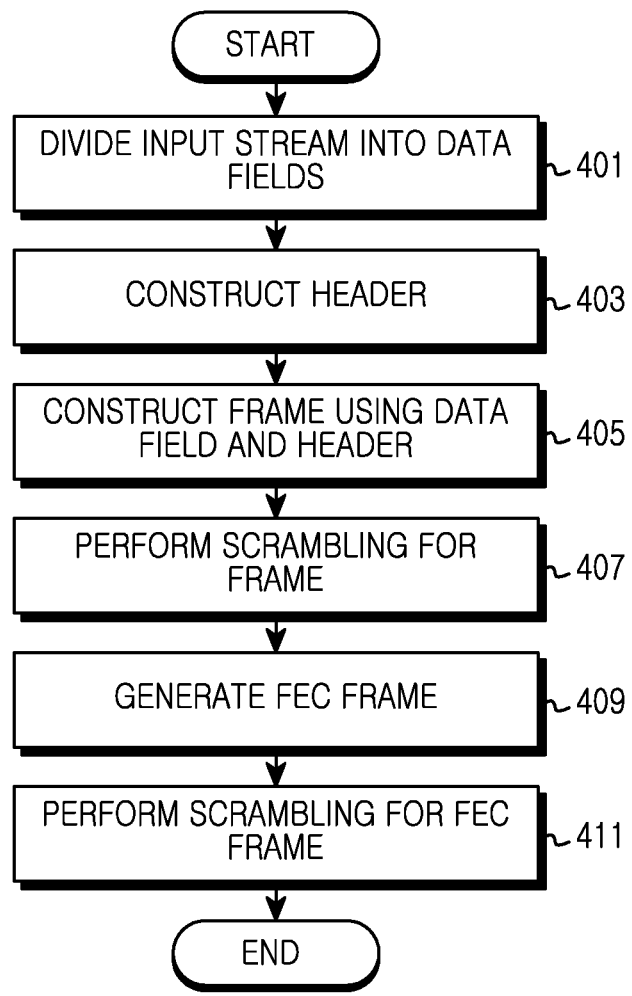
FIG. 4 is a flowchart illustrating a procedure for transmitting an ATS using a Forward Error Correction (FEC) error in a transmit end, according to an embodiment of the present invention.

As illustrated in FIGS. 1 to 4 below, a transmit end of a communication system can provide compatibility for a newly defined input stream using a CRC error or an FEC error. For example, when the transmit end transmits a newly defined input stream (i.e., ATS), as illustrated in FIG. 1, the transmit end changes a field for CRC check of a frame header or introduces a new value as a CRC value, so that an existing receive end can distinguish the newly defined input stream (i.e., ATS). In another example, as illustrated in FIG. 2 or 3 below, the transmit end scrambles a frame header so that the existing receive end can distinguish a newly defined input stream. In a further example, as illustrated in FIG. 4 below, the transmit end scrambles a frame so that the existing receive end can distinguish a newly defined input stream. The existing receive end represents a receive end capable of processing only a previously defined input stream, such as, for example, an MPEG2-TS.

FIG. 1 illustrates a procedure for transmitting an ATS in a transmit end, according to an embodiment of the present invention.

Referring to FIG. 1, when the transmit end transmits a newly defined input stream (i.e., ATS), the transmit end divides the newly defined input stream (i.e., ATS) into units of frame construction, in step 101. For example, the transmit end divides the newly defined input stream into data field units constructing a frame.

In step 103, the transmit end constructs a header including information of the newly defined input stream. The transmit end can express the newly defined input stream using a value of a specific field included in the frame header. For example, for a Digital Video Broadcasting-2$^{nd}$ Generation Terrestrial/Cable/Satellite (DVB-T2/C2/S2) system, the frame header includes a MATYPE field of 2 bytes and a CRC-8 MODE field of 1 byte. The CRC-8 MODE field is constructed by exclusive OR of a CRC-8 field of 1 byte and a MODE field of 1 byte. To express the newly defined input stream (i.e., ATS), the transmit end sets the MODE field as 'FFh' or 'FEh'. In another example, the transmit end may set an EXT field within the MATYPE field as a specific value (e.g., '11'). In a further example, when the transmit end has only one input stream, i.e., when a Single Input Stream or Multiple Input Stream (SIS/MIS) field within the MATYPE field is equal to '1', the transmit end can express the newly defined input stream (i.e., ATS) using a value of the second byte of the MATYPE field. The transmit end can set the value of the second byte of the MATYPE field as 'FFh'. To express the newly defined input stream (i.e., ATS), the transmit end can use each scheme among the three examples, or can apply at least two schemes among the three examples together.

The transmit end constructs a frame using the divided data and the header, in step 105. When the transmit end constructs a frame of a fixed length, the transmit end may add padding to the data and the header.

After constructing the frame, the transmit end scrambles the frame according to a preset scrambling scheme, in step 107.

After scrambling the frame, the transmit end adds at least one of a Bose, Chaudhuri, Hocque-nghem (BCH) code and a Low-Density Parity-Check (LDPC) code to the scrambled frame, generating a FEC frame, in step 109.

As described above, when a transmit end constructs and transmits a header including information of a newly defined input stream, an existing receive end recognizes that a CRC error occurs in a corresponding signal through the header. Thus, the existing receive end does not restore the signal.

In the above-described embodiment of the present invention, a transmit end generates a CRC error of an existing receive end using at least one of a MATYPE field and a MODE field that are included in a header to distinguish a newly defined input stream (i.e., ATS), and preserves compatibility with an existing input stream.

In another embodiment of the present invention, as illustrated in FIGS. 2 and 3 below, the transmit end scrambles a header to distinguish a newly defined input stream (i.e., ATS), and preserves compatibility with an existing input stream.

FIG. 2 illustrates a procedure for transmitting an ATS using a scrambled header in a transmit end, according to an embodiment of the present invention.

Referring to FIG. 2, when the transmit end transmits a newly defined input stream, the transmit end divides the newly defined input stream into units of frame construction, in step 201. For example, the transmit end divides the newly defined input stream into data field units constructing a frame.

Also, in step 203, the transmit end constructs a header that includes construction information of data which will construct the frame.

The transmit end scrambles the header in step 205.

After scrambling the header, the transmit end constructs a frame using the divided data and the scrambled header, in step 207. When the transmit end constructs a frame of a fixed length, the transmit end may add padding to the data and the scrambled header according to the frame length.

After constructing the frame, the transmit end scrambles the frame according to a preset scrambling scheme, in step 209. A scrambling scheme of the frame and a scrambling scheme of the header may be either the same as or different from each other.

After scrambling the frame, the transmit end adds at least one of a BCH code and an LDPC code to the scrambled frame, generating a FEC frame, in step 211.

FIG. 3 illustrates a procedure for transmitting an ATS using a scrambled header in a transmit end, according to another embodiment of the present invention.

Referring to FIG. 3, when the transmit end transmits a newly defined input stream, the transmit end divides the newly defined input stream into units of frame construction, in step 301. For example, the transmit end divides the newly defined input stream into data field units constructing a frame.

In step 303, the transmit end constructs a header that includes construction information of data which will construct the frame.

The transmit end adds the constructed header to the divided data field, in step 305.

After adding the header to the data field, the transmit end scrambles only the header, in step 307.

After scrambling the header, the transmit end adds padding to data to which the scrambled header is added, and constructs a frame, in step 309. For example, the transmit end adds padding to data to which the scrambled data is added, and constructs a Base Band (BB) frame.

After constructing the frame, the transmit end scrambles the frame according to a preset scrambling scheme, in step 311. A scrambling scheme of the frame and a scrambling scheme of the header may be either the same as or different from each other.

After scrambling the frame, the transmit end adds at least one of a BCH code and an LDPC code to the scrambled frame, generating a FEC frame, in step 313.

As described above, when a transmit end scrambles a header separately, an existing receive end recognizes that a CRC error occurs because it cannot identify the header. Thus, the existing receive end does not restore a signal of a newly defined input stream.

In the above-described embodiment of the present invention, the transmit end distinguishes a newly defined input stream (i.e., ATS) using a CRC error, and preserves compatibility with an existing input stream.

In another embodiment of the present invention, the transmit end can distinguish a newly defined input stream (i.e., ATS) using an FEC error, and preserve compatibility with an exiting input stream.

FIG. 4 illustrates a procedure for transmitting an ATS using a scrambled FEC frame in a transmit end, according to an embodiment of the present invention.

Referring to FIG. 4, when the transmit end transmits a newly defined input stream, the transmit end divides the newly defined input stream into units of frame construction, in step 401. For example, the transmit end divides the newly defined input stream into data field units constructing a frame.

In step 403, the transmit end constructs a header that includes construction information of data which will construct the frame.

The transmit end adds the header to the divided data and constructs a frame, in step 405. When the transmit end constructs a frame of a fixed length, the transmit end may add padding to the data and the header according to the frame length.

After constructing the frame, the transmit end scrambles the frame according to a preset scrambling scheme, in step 407.

After scrambling the frame, the transmit end adds at least one of a BCH code and an LDPC code to the scrambled frame, generating a FEC frame, in step 409.

After constructing the FEC frame, the transmit end scrambles the FEC frame, in step 411. For example, the transmit end scrambles all or part of the FEC frame. A scrambling scheme of the frame and a scrambling scheme of the FEC frame may be either the same as or different from each other. If the scrambling schemes of the frame and the FEC frame are different from each other, the transmit end can scramble the FEC frame using a polynomial, an initialization sequence, or an eXclusive OR (XOR) order of scrambling symbols different from that of the scrambling scheme of the frame.

As described above, when a transmit end scrambles an FEC frame, an existing receive end recognizes that an FEC error occurs in a corresponding signal because it fails to recognize the scrambled FEC frame. Thus, the existing receive end does not restore the signal.

Figure 5:
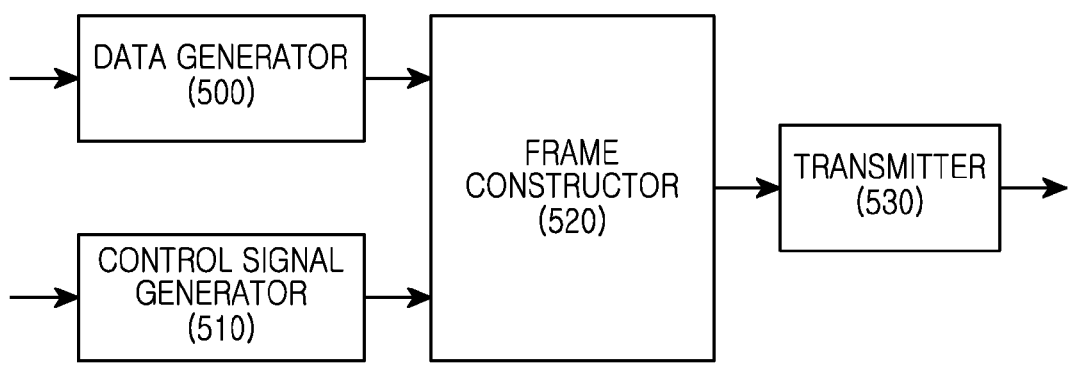
FIG. 5 is a block diagram illustrating a construction of a transmit end, according to an embodiment of the present invention.

FIG. 5 illustrates a construction of a transmit end, according to an embodiment of the present invention.

As illustrated in FIG. 5, the transmit end includes a data generator 500, a control signal generator 510, a frame constructor 520, and a transmitter 530.

When the transmit end transmits a newly defined input stream, the data generator 500 divides the newly defined input stream into units of frame construction. For example, the data generator 500 includes a video encoder, an audio encoder, a video packetizer, an audio packetizer, and a Transport Stream Multiplexer (TS MUX). The video encoder compresses video data according to a corresponding video coder/decoder (codec). The audio encoder compresses audio data according to a corresponding audio codec. The video packetizer divides video data compressed in the video encoder into constant units and generates video Packetized Elementary Stream (PES) packets. The audio packetizer divides audio data compressed in the audio encoder into constant units and generates audio PES packets. The TS MUX generates an input stream using the video PES packets and the audio PES packets.

The control signal generator 510 generates a header to be added to data divided in the data generator 500. The control signal generator 510 can express a newly defined input stream (i.e., ATS) using at least one of a MATYPE field and a CRC-8 MODE field that are included in a frame header. For example, to express the newly defined input stream, the control signal generator 510 sets a MODE field of the CRC-8 MODE field as 'FFh' or 'FEh'. In another example, the control signal generator 510 may set an EXT field within the MATYPE field of the frame header as a specific value (e.g., '11'). In a further example, when an SIS/MIS within the MATYPE field of the frame header is equal to '1', the control signal generator 510 may set a value of the second byte of the MATYPE field as 'FFh'. In yet another example, the control signal generator 510 may use at least two schemes among the three examples together to express the newly defined input stream.

The frame constructor 520 adds a header provided from the control signal generator 510 to data provided from the data generator 500, and generates transmission packets. The frame constructor is described in detail below with respect to FIGS. 6-8. The frame constructor 520 adds a scrambled header to data provided from the data generator 500, thereby constructing a frame. In another example, the frame constructor 520 adds a header provided from the control signal generator 510 to data provided from the data generator 500, thereby constructing a frame. The frame constructor 520 may scramble the header of the frame. In a further example, the frame constructor 520 adds a header provided from the control signal generator 510 to data provided from the data generator 500, thereby constructing a frame. The frame constructor 520 scrambles the constructed frame. The frame constructor 520 may scramble an FEC frame generated by channel coding for the frame.

The transmitter 530 transmits channel-coded transmission packets through a channel. The channel can be a wired channel or a wireless channel. In a case of the wireless channel, the transmitter 530 generates modulation symbols by modulating a bit stream of the transmission packets, performs physical layer processing according to a standard of a communication system, up converts the processing result into a Radio Frequency (RF) band signal, and transmits the RF band signal through an antenna.

Figure 6:
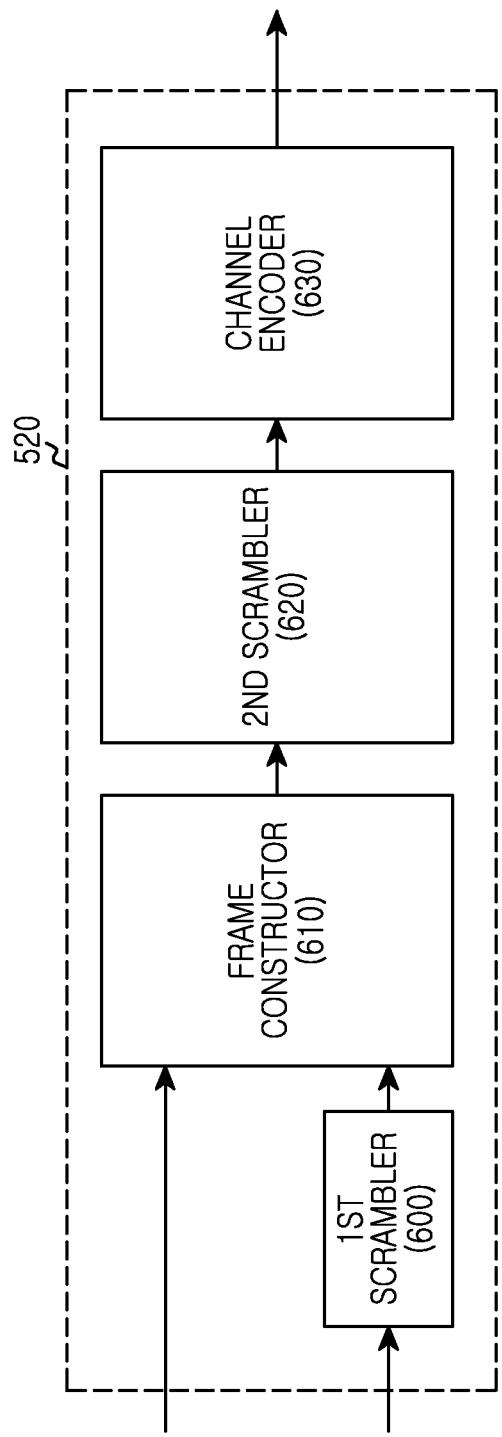
FIG. 6 is a block diagram illustrating a detailed construction of a frame constructor using a CRC error in a transmit end, according to an embodiment of the present invention.
Figure 7:
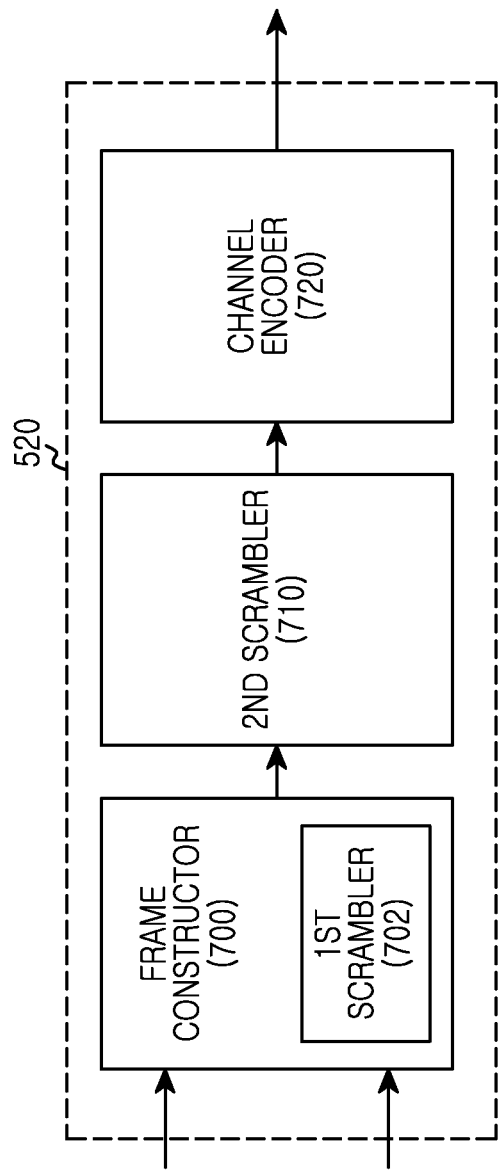
FIG. 7 is a block diagram illustrating a detailed construction of a frame constructor using a CRC error in a transmit end, according to another embodiment of the present invention.

When the transmit end transmits a newly defined input stream using a CRC error, the frame constructor 520 can be constructed as illustrated in FIG. 6 or 7 below.

FIG. 6 is a diagram illustrating a detailed construction of a frame constructor in a transmit end, according to an embodiment of the present invention.

As illustrated in FIG. 6, the frame constructor 520 includes 1st and 2nd scramblers 600 and 620, a frame constructor 610, and a channel encoder 630.

The 1st scrambler 600 scrambles a header provided from the control signal generator 510.

The frame constructor 610 adds a header scrambled in the 1st scrambler 600 to data provided from the data generator 500, thereby constructing a frame. When the transmit end constructs a frame of a fixed length, the frame constructor 610 may add padding to the frame.

The 2nd scrambler 620 scrambles a frame constructed in the frame constructor 610. Scrambling schemes of the 1st and 2nd scramblers 600 and 620 may be either the same as or different from each other.

The channel encoder 630 performs channel coding for a frame scrambled in the 2nd scrambler 620. Specifically, the channel encoder 630 adds at least one of a BCH code and an LDPC code to the frame scrambled in the 2nd scrambler 620, thereby constructing an FEC frame.

FIG. 7 is a diagram illustrating a detailed construction of a frame constructor in a transmit end, according to another embodiment of the present invention.

As illustrated in FIG. 7, the frame constructor 520 includes a frame constructor 700, a 2nd scrambler 710, and a channel encoder 720.

The frame constructor 700 adds a header provided from the control signal generator 510 to data provided from the data generator 500, thereby constructing a frame. When the transmit end constructs a frame of a fixed length, the frame constructor 700 may add padding to the frame.

The frame constructor 700 scrambles the header included in the frame using a 1st scrambler 702.

The 2nd scrambler 710 scrambles a frame constructed in the frame constructor 700. Scrambling schemes of the 1st and 2nd scramblers 702 and 710 may be either the same as or different from each other.

The channel encoder 720 performs channel coding for a frame scrambled in the 2nd scrambler 710. Specifically, the channel encoder 720 adds at least one of a BCH code and an LDPC code to the frame scrambled in the 2nd scrambler 710, thereby constructing an FEC frame.

Figure 8:
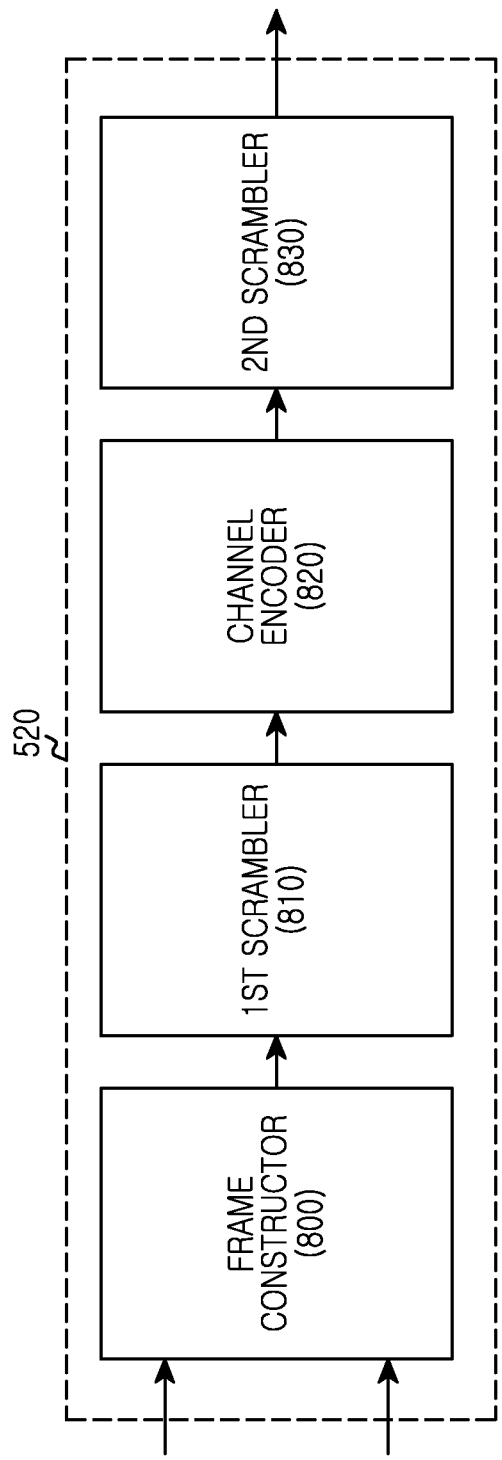
FIG. 8 is a block diagram illustrating a detailed construction of a frame constructor using a FEC error in a transmit end, according to an embodiment of the present invention.

When the transmit end transmits a newly defined input stream using an FEC error, the frame constructor 520 may be constructed as illustrated in FIG. 8 below.

FIG. 8 is a diagram illustrating a detailed construction of a frame constructor in a transmit end, according to another embodiment of the present invention.

As illustrated in FIG. 8, the frame constructor 520 includes a frame constructor 800, 1st and 2nd scramblers 810 and 830, and a channel encoder 820.

The frame constructor 800 adds a header provided from the control signal generator 510 to data provided from the data generator 500, thereby constructing a frame. When the transmit end constructs a frame of a fixed length, the frame constructor 800 may add padding to the frame.

The 1st scrambler 810 scrambles a frame constructed in the frame constructor 800.

The channel encoder 820 performs channel coding for a frame scrambled in the 1st scrambler 810. Specifically, the channel encoder 820 adds at least one of a BCH code and an LDPC code to the frame scrambled in the 1st scrambler 810, thereby constructing an FEC frame.

The 2nd scrambler 830 scrambles the FEC frame constructed in the channel encoder 820. For example, the 2nd scrambler 830 scrambles all or part of the FEC frame. Scrambling schemes of the 1st and 2nd scramblers 810 and 830 may be either the same as or different from each other. When the scrambling schemes of the 1st and 2nd scramblers 810 and 830 are different from each other, the 2nd scrambler 830 can scramble the FEC frame using a polynomial, an initialization sequence, or an XOR order of scrambling symbols different from that of the 1st scrambler 810.

In the above-described embodiment of the present invention, a transmit end provides compatibility of a newly defined input stream using a CRC error or an FEC error.

In another embodiment of the present invention, a transmit end may add information of a newly defined input stream to a super frame header and provide compatibility with a legacy system. The transmit end may add the newly defined input stream information to the super frame header, and provide compatibility of the newly defined input stream additionally using at least one of a CRC error and an FEC error.

As described above, when a transmit end expresses a newly defined input stream using a CRC error or an FEC error, an existing receive end determines that the CRC error or FEC error occurs in a reception signal including the newly defined input stream. Thus, the existing receive end does not restore the reception signal including the newly defined input stream.

However, when a new receive end previously recognizes an expression scheme of a newly defined input stream of a transmit end, the new receive end can restore a reception signal including the newly defined input stream according to the expression scheme. Also, when a CRC error or an FEC error occurs in a reception signal, a new receive end recognizes that the reception signal is composed of a newly defined input stream. Thus, the new receive end can identify an expression scheme of the newly defined input stream of the transmit end and restore the reception signal including the newly defined input stream. The new receive end represents a receive end capable of processing not only a previously defined input stream, such as, an MPEG2-TS, but also a newly defined input stream.

Figure 9:
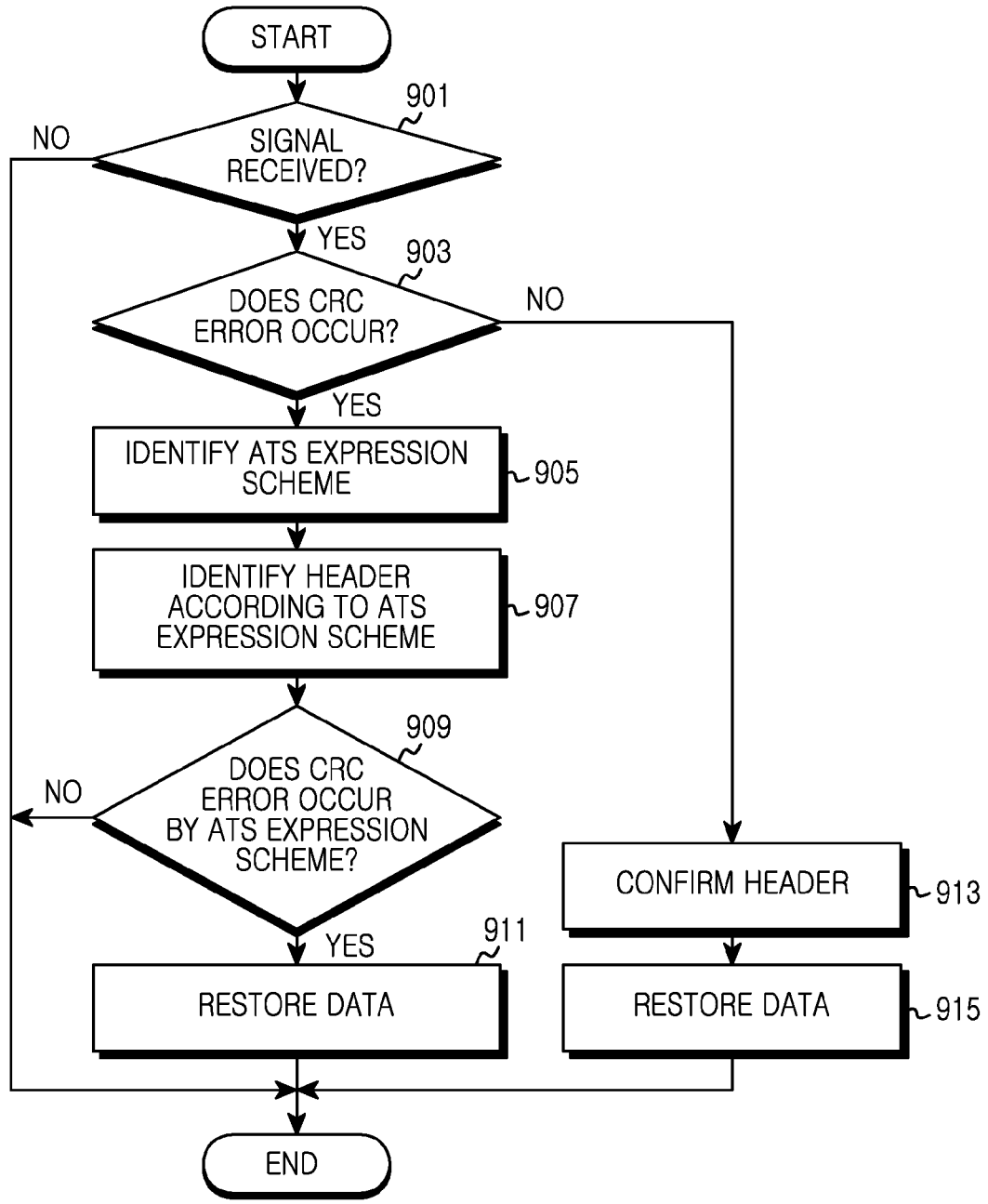
FIG. 9 is a flowchart illustrating a procedure for identifying an ATS using a CRC error in a receive end, according to an embodiment of the present invention.

FIG. 9 is a diagram illustrating a procedure for identifying an ATS using a CRC error in a receive end, according to an embodiment of the present invention.

Referring to FIG. 9, in step 901, it is determined if a signal is received.

If a signal is received, the receive end determines if a CRC error occurs in the reception signal, in step 903.

If the CRC error occurs in the reception signal, the receive end identifies a scheme in which a transmit end expresses a newly defined input stream (i.e., ATS), in step 905, so as to identify if the reception signal includes the newly defined input stream (i.e., ATS). For example, the receive end identifies if the transmit end expresses the newly defined input stream using a value of a specific field included in a frame header, or if the transmit end expresses the newly defined input stream through additional scrambling for the frame header.

The receive end identifies the frame header according to the identified scheme in which the transmit end expresses the newly defined input stream, in step 907. For example, when the transmit end expresses the newly defined input stream using the value of the specific field of the frame header, the receive end identifies if the value of the specific field of the frame header expresses the newly defined input stream. The specific field includes at least one of a MODE field of a CRC-8 MODE field, an EXT field within a MATYPE field, and a value of the second byte of the MATYPE field. In another example, when the transmit end expresses the newly defined input stream through the additional scrambling for the frame header, the receive end restores the frame header through descrambling for the frame header. For the transmit end to express the newly defined input stream, the receive end can previously know and recognize a scheme of scrambling a header or be provided with the scrambling scheme through a separate control signal.

After identifying the frame header, the receive end determines if a CRC error occurs by the scheme for expressing the newly defined input stream. For example, when the value of the specific field of the frame header is the same as a value expressing the newly defined input stream, the receive end recognizes that the CRC error occurs by the scheme for expressing the newly defined input stream. In another example, when the transmit end expresses the newly defined input stream through the additional scrambling for the frame header, the receive end again identifies if the CRC error occurs in a descrambled frame header.

If the CRC error does not occur by the scheme for expressing the newly defined input stream, the receive end determines that it cannot restore the reception signal because of the error included in the reception signal. Thus, the receive end terminates the methodology.

In contrast, if the CRC error occurs by the scheme for expressing the newly defined input stream, the receive end restores data using data field construction information included in the frame header, in step 911.

If it is determined in step 903 that the CRC error does not occur in the reception signal, the receive end analyzes a frame header, acquiring data field construction information, in step 913.

The receive end restores data using the data field construction information included in the frame header, in step 915.

In the above-described embodiment of the present invention, when a CRC error occurs, a receive end identifies if a newly defined input stream (i.e., ATS) is included.

In another embodiment of the present invention, when an FEC error occurs, the receive end can identify if a newly defined input stream (i.e., ATS) is included.

Figure 10:
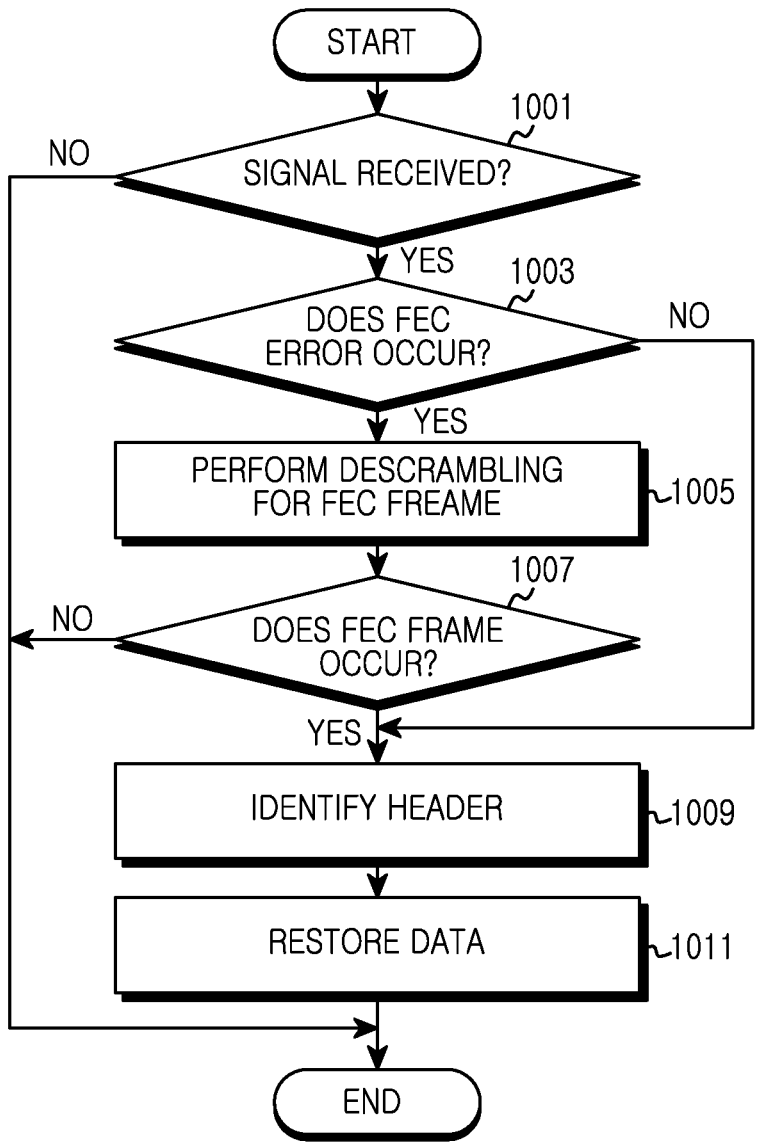
FIG. 10 is a flowchart illustrating a procedure for identifying an ATS using an FEC error in a receive end, according to an embodiment of the present invention.

FIG. 10 is a diagram illustrating a procedure for identifying an ATS using an FEC error in a receive end, according to an embodiment of the present invention.

Referring to FIG. 10, in step 1001, the receive end determines if a signal is received.

If the signal is received, the receive end determines if an FEC error occurs in the reception signal, in step 1003.

If the FEC error occurs in the reception signal, the receive end descrambles the FEC frame, in step 1005. For a transmit end to express a newly defined input stream (i.e., ATS), the receive end can previously know and recognize a scheme for scrambling a FEC frame or be provided with the scrambling scheme through a separate control signal.

The receive end determines if a FEC error occurs in the descrambled FEC frame, in step 1007.

If the FEC error occurs in the descrambled FEC frame, the receive end determines that it cannot restore the reception signal because of the error of the reception signal, and the methodology terminates.

In contrast, if the FEC error does not occur in the descrambled FEC frame, the receive end recognizes that the FEC error occurring in step 1003 occurs by the scheme for expressing the newly defined input stream. Thus, the receive end analyzes a frame header, thereby acquiring data field construction information, in step 1009.

The receive end restores data using the data field construction information included in the frame header, in step 1011.

If it is determined in step 1003 that the FEC error does not occur in the reception signal, the receive end jumps to step 1009 and analyzes a frame header, acquiring data field construction information.

The receive end restores data using the data field construction information included in the frame header, in step 1011.

Figure 11:
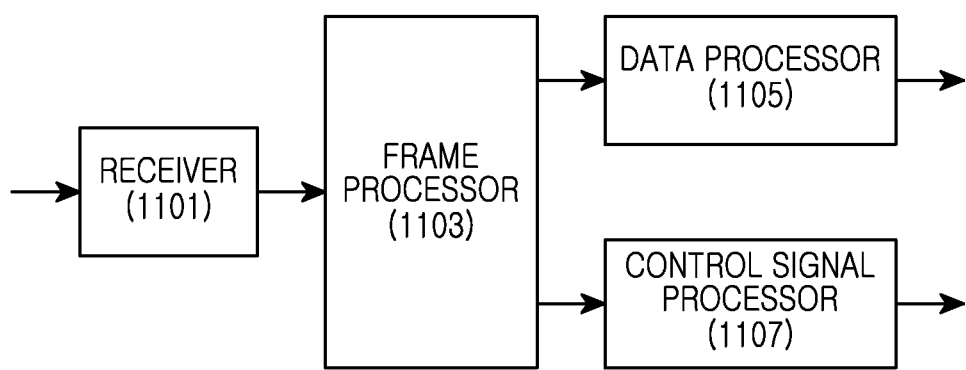
FIG. 11 is a block diagram illustrating a construction of a receive end, according to an embodiment of the present invention.

FIG. 11 is a diagram illustrating a construction of a receive end, according to an embodiment of the present invention.

As illustrated in FIG. 11, the receive end includes a receiver 1101, a frame processor 1103, a data processor 1105, and a control signal processor 1107.

The receiver 1101 restores channel-coded transmission packets from a signal received through a channel. The channel can be a wired channel or a wireless channel. In a case of the wireless channel, the receiver 1101 converts an RF band signal received through an antenna into a baseband signal. The receiver 1101 demodulates the baseband signal and restores a bit stream.

The frame processor 1103 separates a header and data from a transmission packet provided from the receiver 1101 and provides the header and data to the control signal processor 1107 and the data processor 1105. The frame processor 1103 identifies if a CRC error or an FEC error occurs in the reception signal. For example, when the CRC error occurs in the reception signal, the frame processor 1103 confirms a value set to a specific field of a frame header and identifies if the CRC error occurs to express a newly defined input stream. If it is identified that the CRC error is not an error occurring to express the newly defined input stream, the frame processor 1103 does not restore the reception signal. In contrast, if it is identified that the CRC error occurs to express the newly defined input stream, the frame processor 1103 separates the header and data from the reception signal and provides the header and data to the control signal processor 1107 and the data processor 1105. The specific field includes at least one of a MODE field of a CRC-8 MODE field, an EXT field within a MATYPE field, and a value of the second byte of the MATYPE field.

In another example, when a CRC error occurs in the reception signal, the frame processor 1103 descrambles a frame header. The frame processor 1103 again identifies a CRC error of the descrambled frame header. When the CRC error occurs in the descrambled frame header, the frame processor 1103 does not restore the reception signal. In contrast, when the CRC error does not occur in the descrambled frame header, the frame processor 1103 separates the header and data from the reception signal and provides the header and data to the control signal processor 1107 and the data processor 1105.

In a further example, when an FEC error occurs in the reception signal, the frame processor 1103 descrambles an FEC frame. The frame processor 1103 again identifies an FEC error of the descrambled FEC frame. When the FEC error occurs in the descrambled FEC frame, the frame processor 1103 does not restore the reception signal. In contrast, when the FEC error does not occur in the descrambled FEC frame, the frame processor 1103 separates the header and data from the reception signal and provides the header and data to the control signal processor 1107 and the data processor 1105.

The data processor 1105 restores video data and audio data from data provided from the frame processor 1103 according to data construction information identified in the control signal processor 1107. For example, the data processor 1105 includes a video decoder and an audio decoder.

The video decoder decompresses video data compressed according to a video compression codec used in a transmit end, and restores the video data. The audio decoder decompresses audio data compressed according to an audio compression codec used in the transmit end, and restores the audio data.

The control signal processor 1107 restores a header of a frame provided from the frame processor 1103, thereby acquiring data construction information.

In the above-described construction, the frame processor 1103 can perform functions of the data processor 1105 and the control signal processor 1107. In embodiments of the present invention, these are separately constructed in order to distinguish and describe respective functions. Thus, in actual realization, construction may be such that all or part of the functions is processed in the frame processor 1103.

As described above, embodiments of the present invention have an advantage of providing a service of a newly defined schema without changing a header construction scheme, by expressing the type of a newly defined input stream using at least one of a CRC error and an FEC error in a transmit end of a communication system.

While the invention has been shown and described with reference to certain embodiments thereof, it will be understood by those skilled in the art that various changes in form and detail may be made therein without departing from the spirit and scope of the invention as defined by the appended claims.

What is claimed is:

1. A method of a transmitter in a broadcasting communication system, the method comprising:
generating a frame for an input stream;
scrambling a header of the frame; and
transmitting the frame comprising the scrambled header to a receiver,
wherein a decoding error for the input stream occurs in the receiver by scrambling of the header,
wherein a type of the input stream is identified by the receiver based on the decoding error for the input stream, and
wherein the type indicates whether the input stream comprises a plurality of packets of a variable length or comprises a plurality of packets of a fixed length.

2. The method of claim 1, further comprising:
scrambling the frame; and
constructing a forward error correction (FEC) frame by adding at least one of a Bose, Chaudhuri, Hocquenghem (BCH) code and a low-density parity-check (LDPC) code to the scrambled frame.

3. The method of claim 2, wherein, when a scrambling scheme for the header and a scrambling scheme for the frame are different from each other, the scrambling scheme for the frame is different in at least one of a polynomial, an initialization sequence, and an exclusive OR (XOR) order of scrambling symbols from the scrambling scheme of the header.

4. A method of a transmitter in a broadcasting communication system, the method comprising:
generating a frame for an input stream;
scrambling a header of the frame; and
transmitting the frame comprising the scrambled header to a receiver,
wherein at least one bit is padded to the input stream,
wherein a decoding error for the input stream occurs in the receiver by the scrambling of the header,
wherein a type of the input stream is identified by the receiver based on the decoding error for the input stream, and
wherein the type indicates whether the input stream comprises a plurality of packets of a variable length or comprises a plurality of packets of a fixed length.

5. The method of claim 4, further comprising:
scrambling the frame; and
constructing a forward error correction (FEC) frame by adding at least one of a Bose, Chaudhuri, Hocquenghem (BCH) code and a low-density parity-check (LDPC) code to the scrambled frame.

6. The method of claim 5, wherein, when a scrambling scheme of the header and a scrambling scheme of the frame are different from each other, the scrambling scheme of the frame is different in at least one of a polynomial, an initialization sequence, and an exclusive OR (XOR) order of scrambling symbols from the scrambling scheme of the header.

7. A method of transmitting a signal in a broadcasting communication system, the method comprising:
generating a first frame for an input stream;
generating a second frame by scrambling the first frame according to a first scheme;
generating a third frame by encoding the second frame;
generating a fourth frame by scrambling the third frame according to a second scheme; and
transmitting the fourth frame to a receiver,
wherein a decoding error for the input stream occurs in the receiver by the scrambling of the third frame according to the second scheme,
wherein a type of the input stream is identified by the receiver based on the decoding error for the input stream, and
wherein the type indicates whether the input stream comprises a plurality of packets of a variable length or comprises a plurality of packets of a fixed length.

8. The method of claim 7, wherein the second scheme is different from the first scheme in at least one of a polynomial, an initialization sequence, and an exclusive OR (XOR) order of scrambling symbols from the scrambling scheme of the frame.

9. An apparatus of a transmitter in a broadcasting communication system, the apparatus comprising:
a processor configured to:
generate a frame for an input stream, and
scramble a header of the frame; and
at least one transceiver configured to transmit the frame comprising the scrambled header to a receiver,
wherein a decoding error for the input stream occurs in the receiver by the scrambling of the header,
wherein the type of the input stream is identified by the receiver based on the decoding error for the input stream, and
wherein the type indicates whether the input stream comprises a plurality of packets of a variable length or comprises a plurality of packets of a fixed length.

10. The apparatus of claim 9, wherein the processor is further configured to scramble the frame, and construct a forward error correction (FEC) frame by adding at least one of a Bose, Chaudhuri, Hocquenghem (BCH) code and a low-density parity-check (LDPC) code to the scrambled frame.

11. The apparatus of claim 10, wherein, when a scrambling scheme for the header and a scrambling scheme for the frame are different from each other, the scrambling scheme for the frame is different in at least one of a polynomial, an initialization sequence, and an exclusive OR (XOR) order of scrambling symbols from the scrambling scheme of the header.

12. An apparatus of a transmitter in a broadcasting communication system, the apparatus comprising:
a processor configured to:
generate a frame for an input stream, and
scramble a header of the frame; and
at least one transceiver configured to transmit the frame comprising the scrambled header to a receiver,
wherein at least one bit is padded to the input stream,
wherein a decoding error for the input stream occurs in the receiver by the scrambling of the header,
wherein the type of the input stream is identified by the receiver based on the decoding error for the input stream, and
wherein the type indicates whether the input stream comprises a plurality of packets of a variable length or comprises a plurality of packets of a fixed length.

13. The apparatus of claim 12, wherein the processor is further configured to scramble the frame, and construct a forward error correction (FEC) frame by adding at least one of a Bose, Chaudhuri, Hocquenghem (BCH) code and a low-density parity-check (LDPC) code to the scrambled frame.

14. The apparatus of claim 13, wherein, when a scrambling scheme for the header and a scrambling scheme for the frame are different from each other, the scrambling scheme for the frame is different in at least one of a polynomial, an initialization sequence, and an exclusive OR (XOR) order of scrambling symbols from the scrambling scheme of the header.

15. An apparatus of a transmitter in a broadcasting communication system, the apparatus comprising:
a processor configured to:
generate a first frame for an input stream,
generate a second frame by scrambling the first frame according to a first scheme,
generate a third frame by encoding the second frame, and
generate a fourth frame by scrambling the third frame according to a second scheme; and
at least one transceiver configured to transmit the fourth frame to a receiver,
wherein a decoding error for the input stream occurs in the receiver by the scrambling of the third frame according to the second scheme,
wherein a type of the input stream is identified by the receiver based on the decoding error for the input stream, and
wherein the type indicates whether the input stream comprises a plurality of packets of a variable length or comprises a plurality of packets of a fixed length.

16. The apparatus of claim 15, wherein the second scheme is different from the first scheme in at least one of a polynomial, an initialization sequence, and an exclusive OR (XOR) order of scrambling symbols from the scrambling scheme of the frame.

* * * * *